United States Patent
Huang et al.

(10) Patent No.: US 6,579,790 B1
(45) Date of Patent: Jun. 17, 2003

(54) DUAL DAMASCENE MANUFACTURING PROCESS

(75) Inventors: I-Hsiung Huang, Kaohsiung (TW); Jiunn-Ren Hwang, Hsinchu (TW)

(73) Assignee: United Microelectronics, Corp., Hsinchu (TW)

( * ) Notice: Subject to any disclaimer, the term of this patent is extended or adjusted under 35 U.S.C. 154(b) by 40 days.

(21) Appl. No.: 09/707,314

(22) Filed: Nov. 6, 2000

(30) Foreign Application Priority Data

Oct. 26, 2000 (TW) ........................................ 89122540 A

(51) Int. Cl.[7] .................. H01L 21/4763; H01L 21/302; H01L 21/461
(52) U.S. Cl. ........................ 438/637; 438/671; 438/737
(58) Field of Search ................................ 438/637, 763, 438/638, 671, 737, 738; 430/311, 314, 316, 317

(56) References Cited

U.S. PATENT DOCUMENTS 4,370,405 A * 1/1983 O'Toole et al. ............. 430/165
5,126,231 A * 6/1992 Levy ............................ 216/47
5,935,762 A * 8/1999 Dai et al. .................... 430/312
6,326,300 B1 * 12/2001 Liu et al. .................... 438/638
6,329,062 B1 * 12/2001 Gaynor ....................... 423/335

* cited by examiner

*Primary Examiner*—William David Coleman
(74) *Attorney, Agent, or Firm*—Charles C. H. Wu; Wu & Cheung, LLP

(57) ABSTRACT

A method of fabricating a dual damascene opening in a dielectric layer above a substrate. A first photoresist layer having a first opening therein is formed over the dielectric layer. The first opening exposes the dielectric layer at a position where a via is desired. A buffer layer is formed over the first photoresist layer. A second photoresist layer having a second opening is formed over the buffer layer. The second opening exposes the area where a conductive wire is desired. The first opening and the second opening together form a metallic interconnect structure. Using the first and the second photoresist layer as a mask, a dual damascene structural opening that includes a via opening and a conductive wire trench is formed in the dielectric layer.

23 Claims, 3 Drawing Sheets

DUAL DAMASCENE MANUFACTURING PROCESS

CROSS-REFERENCE TO RELATED APPLICATION

This application claims the priority benefit of Taiwan application serial no. 89122540, filed Oct. 26, 2000.

BACKGROUND OF THE INVENTION

1. Field of Invention

The present invention relates to a method of manufacturing the multi-level interconnects of an integrated circuit. More particularly, the present invention relates to a dual damascene manufacturing process.

2. Description of Related Art

Dual damascene process is a technique of forming vias and interconnects for connecting devices in an integrated circuit. The dual damascene process includes forming an insulation layer over a substrate. After planarizing the upper surface of the insulation layer, the insulation layer is etched according to predetermined metal wiring pattern and positions of vias. Ultimately, trenches and via openings are formed. Subsequently, metallic material is deposited into the trenches and the openings to form a metallic layer, thereby forming metallic conductive wires and vias concurrently. Finally, chemical-mechanical polishing (CMP) is conducted to planarize device surface.

The dual damascene process can prevent overlay errors and process bias problems caused by forming the vias and then the metallic conductive wires in a conventional photolithography. Since vias and interconnects formed by a dual damascene process has greater reliability, most semiconductor manufacturers prefer the process over other processes especially for producing highly integrated circuits.

FIGS. 1A through 1C are schematic cross-sectional views showing the progression of steps for fabricating a conventional dual damascene structure.

As shown in FIG. 1A, a dielectric layer 104 is formed over a substrate 100 having a metallic layer 102 therein. A patterned photoresist layer 106 that exposes a portion of the dielectric layer 104 is formed over the dielectric layer 104.

As shown in FIG. 1B, a portion of the dielectric layer 104 is removed using the patterned photoresist layer 106 (as shown in FIG. 1A) as a mask until a portion of the metallic layer 102 is exposed. The dielectric layer 104 is thereby converted into a dielectric layer 104a with a via opening 108 therein. The patterned photoresist layer 106 is removed and then another patterned photoresist layer 110 is formed over the substrate 100.

As shown in FIG. 1C, a portion of the dielectric layer 104a is removed using the patterned photoresist layer 110 (as shown in FIG. 1B) as a mask. Ultimately, the dielectric layer 104a is converted into a dielectric layer 104b having both a via opening 108 and a conductive wire trench 112. The via opening 108 and the conductive wire trench 112 together constitute a dual damascene opening 114. Finally, the patterned photoresist layer 110 is also removed.

In the conventional dual damascene process, altogether two patterned photoresist layers has to be formed so that two photolithographic and etching processes and two photoresist removal steps have to be executed as well. In addition, some photoresist residue of the second patterned photoresist layer 110 may still cling to the interior of the via opening 108. Hence, electrical properties of the conductive material subsequently deposited into the via opening 108 may be affected.

SUMMARY OF THE INVENTION

Accordingly, one object of the present invention is to provide a method of fabricating a dual damascene structural opening in a dielectric layer above a substrate. A first photoresist layer having a first opening therein is formed over the dielectric layer. The first opening exposes the dielectric layer at a position where a via is desired. A buffer layer is formed over the first photoresist layer. A second photoresist layer having a second opening therein is formed over the first photoresist layer. The second opening exposes the area where a conductive wire is desired. The first opening and the second opening together form a metallic interconnect structure. Using the first and the second photoresist layer as a mask, a dual damascene structural opening that includes a via opening and a conductive wire trench is formed in the dielectric layer.

According to this invention, a first photoresist layer having a pattern of via openings and a second photoresist layer having a pattern of conductive wire trenches are sequentially formed over the dielectric layer. The first and the second photoresist layer are then used as an etching mask in the production of a dual damascene opening in the dielectric layer.

Since metal interconnect structures (dual damascene opening structure) are directly formed in the two photoresist layers, only one etching operation and one photoresist removal are required after a dual damascene opening is formed in the dielectric layer. Hence, the fabrication process is very much simplified.

In addition, a buffer layer is formed between the first and the second photoresist layer. Since the buffer layer has hydrophilic property, pattern on the first photoresist layer is unaffected by the formation of the second photoresist layer. Moreover, the hydrophilic buffer layer not covered by the second photoresist layer can be removed by developer and cleaning agent when processing the second photoresist layer.

Furthermore, by controlling the etching selectivity between the photoresist layer and the dielectric layer and thickness of the photoresist layer, a dual damascene structure is easily formed with or without an etching stop layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
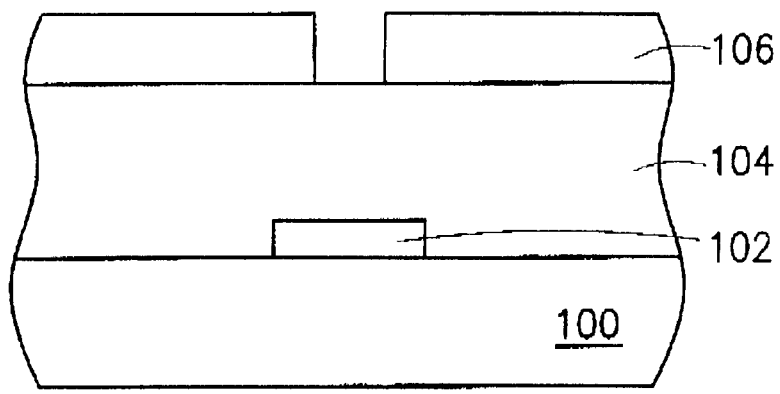
FIGS. 1A through 1C are schematic cross-sectional views showing the progression of steps for fabricating a conventional dual damascene structure.
Figure 1B:
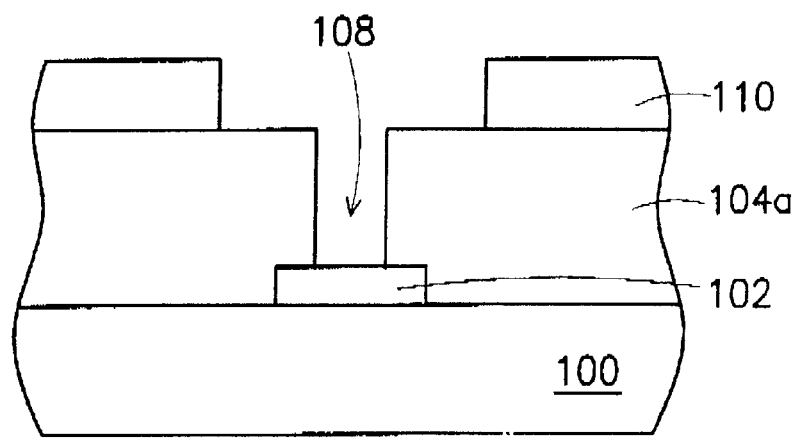
Figure 1C:
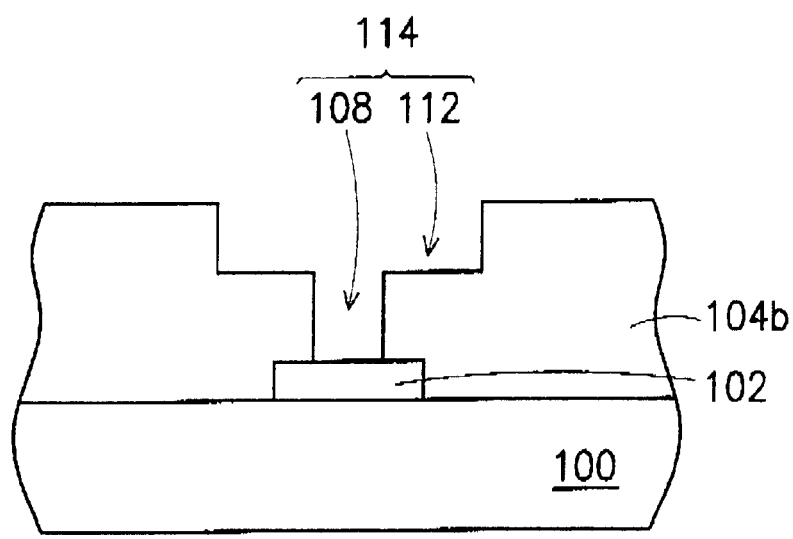

Reference will now be made in detail to the present preferred embodiments of the invention, examples of which are illustrated in the accompanying drawings. Wherever possible, the same reference numbers are used in the drawings and the description to refer to the same or like parts.

Figure 2A:
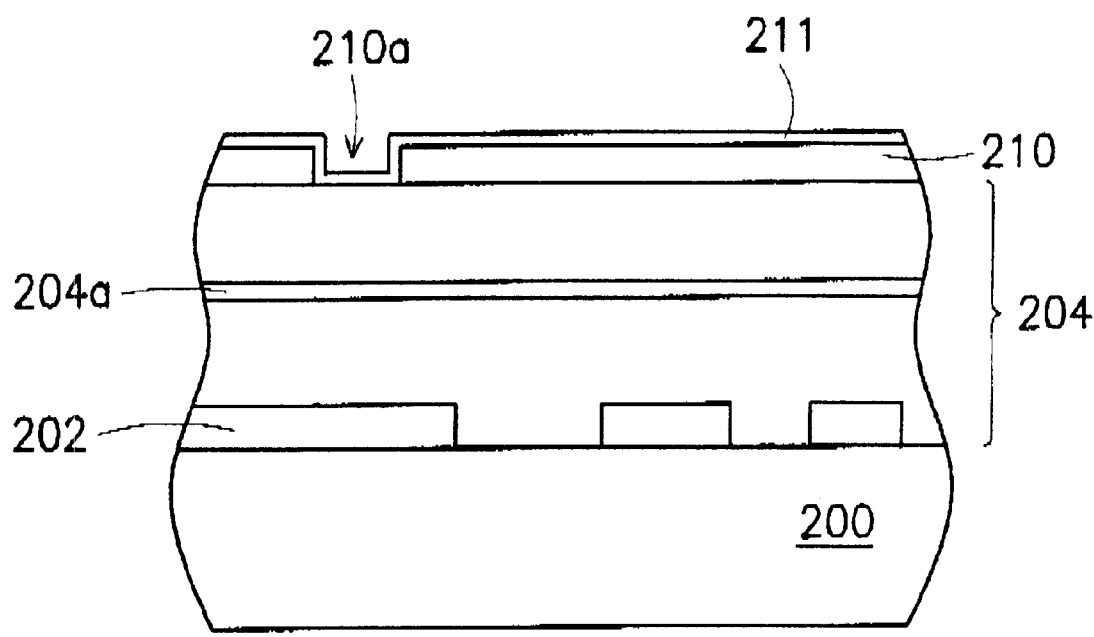
FIGS. 2A through 2C are schematic cross-sectional views showing the progression of steps for fabricating a dual damascene structure according to a first preferred embodiment of this invention.
Figure 2B:
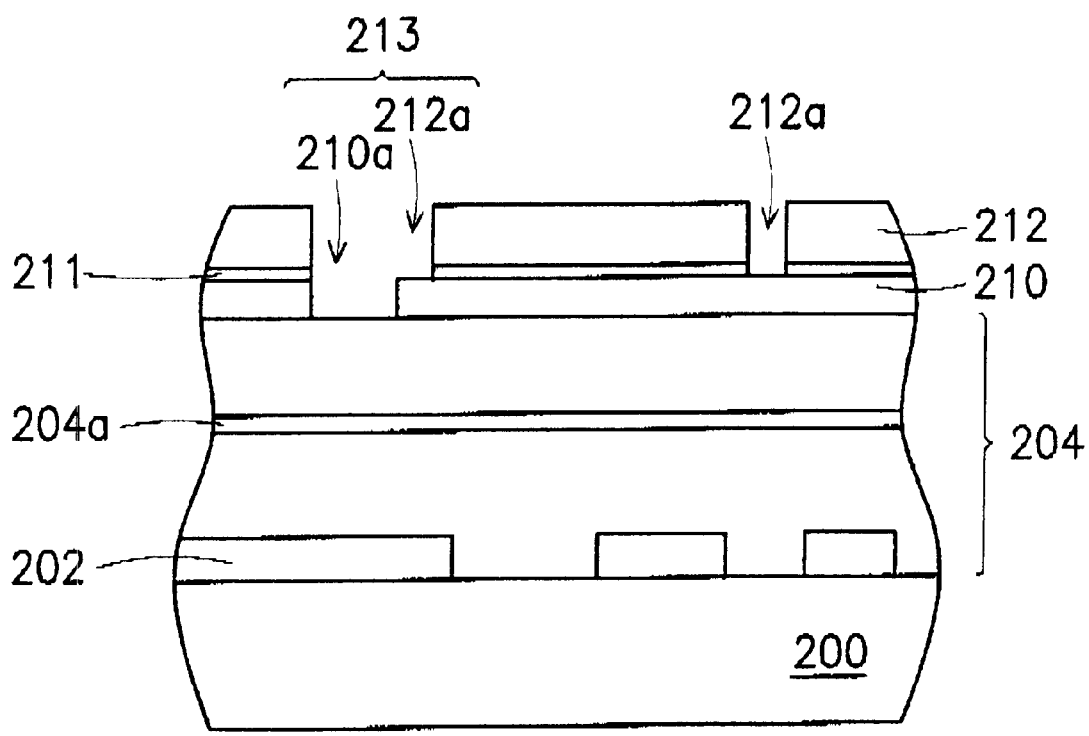
Figure 2C:
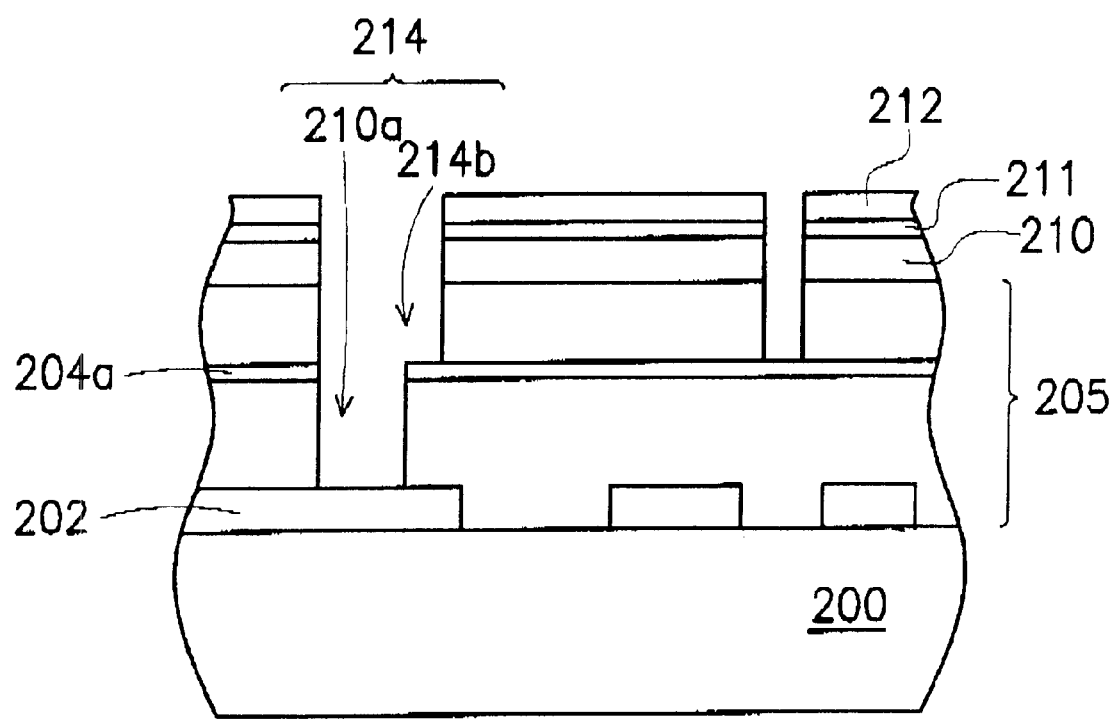

FIGS. 2A through 2C are schematic cross-sectional views showing the progression of steps for fabricating a dual damascene structure according to a first preferred embodiment of this invention.

As shown in FIG. 2A, a dielectric layer 204 is formed over a substrate 200 having a conductive layer 202 therein. Preferably, an etching stop layer 204a is formed inside the dielectric layer 204. The etching stop layer 204a is a silicon nitride layer or a silicon oxynitride layer ($Si_xO_yN_z$) formed, for example, by chemical vapor deposition. The silicon oxynitride layer can serve as an anti-reflection layer for deep ultraviolet (UV) light. The dielectric layer 204 can be silicon oxide layer, preferably a silk or coral layer. The dielectric layer 204 is formed by chemical vapor deposition, for example.

A first photoresist layer 210 is formed over the dielectric layer 204. The first photoresist layer 210 can be a positive photoresist or negative photoresist layer. However, since negative photoresist has a greater adhesive strength than positive photoresist with respect to low dielectric constant material, a negative photoresist is preferably formed over the dielectric layer 204.

The first photoresist layer 210 is soft baked so that solvent within the photoresist material is vaporized away. Ultimately, adhesive strength of the photoresist is increased and selectivity between exposed and non-exposed photoresist after development is enhanced. A photo-exposure operation is conducted to transfer a via opening pattern to the first photoresist layer 210.

A post exposure baking of the first photoresist layer 210 is carried out and then the first photoresist layer 210 is developed to form a lower opening 210a in the first photoresist layer 210. If a negative photoresist material is used to form the first photoresist layer 210, photoresist material will only be retained in the light-exposed regions after chemical development. Because negative photoresist has a higher etching selectivity than positive photoresist relative to the dielectric layer, a thinner negative photoresist, for example, between 0.2 to 0.3 μm, may be used. This has a positive benefit on the resolution and process window of the development process.

A buffer layer 211 is formed over the first photoresist layer 210. The buffer layer 211 is a hydrophilic anti-reflection coating or has a hydrophilic chemical structure.

As shown in FIG. 2B, a second photoresist layer 212 is formed directly over the buffer layer 211. The second photoresist layer 212 is soft baked and then another photo-exposure operation is conducted to transfer a conductive trench pattern to the second photoresist layer 212. A post exposure baking is conducted and then the second photoresist layer 212 is chemically developed to form an upper opening 212a in the second photoresist layer 212. Since the buffer layer 211 has hydrophilic property, the portion of the buffer layer 211 not covered by the second photoresist layer 212 is removed when the second photoresist layer 212 is developed and rinsed. The upper opening 212a and the lower opening 210a together form a metallic interconnect structure 213. The second photoresist layer 212 can be a positive photoresist layer or a negative photoresist layer.

Since the buffer layer 211 is interposed between the first photoresist layer 210 and the second photoresist layer 212, the buffer layer 211 can act as a medium for intermixing of the photoresist materials.

According to the present invention, the etching selectivity of the first photoresist layer 210 relative to the dielectric layer 204 is adjusted so that the etching rate of the dielectric layer 204 is higher than the first photoresist layer 210. Consequently, a portion of the dielectric layer 204, the first photoresist layer 210 and the second photoresist layer 212 are removed. The dielectric layer 204, the first photoresist layer 210 and the second photoresist layer 212 can be removed, for example, by performing anisotropic etching. Ultimately, the metallic interconnect structure 213, in other words, the lower opening 210a pattern on the first photoresist layer 210 and the upper opening 212a pattern on the second photoresist layer 212, is transferred to the dielectric layer 204, as shown in FIG. 2C. Therefore, corresponding via opening 214a and conductive wire trench 214b are formed in the dielectric layer 204. The via opening 214a and the conductive wire trench 214b together form a dual damascene opening, as shown in FIG. 2C. In addition, the via opening 214a exposes a portion of the conductive layer 202. The dielectric layer 204 is also transformed into a dielectric layer 205 having a dual damascene opening 214. In the subsequent step, the first photoresist layer 210 and the second photoresist layer 212 are removed.

To etch out a structure shown in FIG. 2C, the etching stop layer 204a formed inside the dielectric layer 204 is preferably used if a higher process window is desired. Alternatively, if an etching stop layer is absent from the dielectric layer 204, etching can be controlled by fine tuning the thickness of the first photoresist layer 210 and the second photoresist layer 212.

In this invention, a second patterned photoresist layer is formed over a separating buffer layer, which in turn is formed over a first patterned photoresist layer. In other words, a photoresist layer having an upper opening and a lower opening, which constitutes a metallic interconnect pattern 213, is formed over the dielectric layer 204. Thus, through some adjustment of the etching selectivity ratio, only one etching step is required to transfer the metallic interconnect pattern 213 in the photoresist to the dielectric layer 204 and form a dual damascene opening 214. Since only one etching step is required, manufacturing the dual damascene structure is greatly simplified. In addition, by controlling the etching selectivity ratio between the photoresist layer and the dielectric layer, thickness of the interconnects within the dielectric layer can be adjusted. Moreover, a dual damascene opening is formed in the dielectric layer by a single etching operation even if the etching stop layer inside the dielectric layer is missing.

In addition, a buffer layer is formed between the first and the second photoresist layer. Since the buffer layer has hydrophilic property, pattern on the first photoresist layer is unaffected by the formation of the second photoresist layer. Moreover, the hydrophilic buffer layer not covered by the second photoresist layer can be removed by developer and cleaning agent when processing the second photoresist layer.

In conclusion, the advantages of the invention includes the following:

1. To form the dual damascene via, deposition of the photoresist material and exposure of the photoresist layer can be conducted sequentially. Only one etching operation and one photoresist removal process is required. Therefore, the manufacturing process is greatly simplified.

2. By controlling the selectivity ratio between the photoresist layer and the dielectric layer and thickness of the photoresist layer, thickness of the interconnects inside the dielectric layer can be adjusted. Moreover, the dual damascene structure can be formed in the absence of an etching stop layer inside the dielectric layer.

3. Since negative photoresist has a higher etching selectivity relative to the dielectric layer than positive photoresist, a thin negative photoresist layer can be used. A thin negative photoresist layer has the benefit of increasing resolution and process window of the development process. Furthermore, using a thin negative photoresist layer leaves behind fewer residues especially when the aspect ratio is large.

4. By forming a buffer layer between the first and the second photoresist layer, pattern on the first photoresist layer is little affected by the formation of the second photoresist layer. Moreover, the hydrophilic property of the buffer layer enables its removal by various agents when the second photoresist layer is developed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a dual damascene opening in a dielectric layer above a substrate, comprising the steps of:
    forming a first photoresist layer over the dielectric layer, wherein the first photoresist layer has a first opening, and the first opening exposes position of the desired via opening in the dielectric layer;
    forming a buffer layer to cover the first photoresist layer and the first opening;
    forming a second photoresist layer over the buffer layer, wherein the second photoresist layer has a second opening, the second opening exposes position of a desired conductive wire trench in the dielectric layer; and
    etching the dielectric layer using the first photoresist layer and the second photoresist layer as a mask-to form a dual damascene opening having a via opening and a conductive wire trench in the dielectric layer.

2. The method of claim 1, wherein the first photoresist layer includes a negative photoresist layer.

3. She method of claim 1, wherein the second photoresist layer includes a negative photoresist layer.

4. The method of claim 1, wherein the first photoresist layer includes a positive photoresist layer.

5. The method of claim 1, wherein the second photoresist layer includes a positive photoresist layer.

6. The method of claim 1, wherein after the step of forming the first photoresist layer further includes performing a post exposure baking process.

7. The method of claim 1, wherein after the step of forming the second photoresist layer further includes performing a post exposure baking process.

8. The method of claim 1, wherein the step of forming the buffer layer includes depositing to form a hydrophilic anti-reflection coating.

9. The method of claim 1, wherein the step of forming the buffer layer includes depositing a hydrophilic chemical substance.

10. A method of manufacturing a dual damascene opening in a dielectric layer above a substrate, comprising the steps of:
    sequentially forming a first photoresist layer having a first opening therein, a buffer layer to cover the first photoresist layer and the first opening, and a second photoresist layer over the buffer layer; and
    performing an photo-exposure and developing the second photoresist layer to form a conductive wire trench over the first opening and exposing the first opening;
    etching the dielectric layer using the first and the second photoresist layer as a mask to form a dual damascene opening having a second via opening and a second conductive wire trench that correspond to the first via opening and the first conductive wire trench.

11. The method of claim 10, wherein the step of forming the buffer layer includes depositing to form a hydrophilic anti-reflection coating.

12. The method of claim 10, wherein the step of forming the buffer layer includes depositing a hydrophilic chemical substance.

13. The method of claim 10, wherein the first photoresist layer includes a positive photoresist layer.

14. The method of claim 10, wherein the second photoresist layer includes a positive photoresist layer.

15. The method of claim 10, wherein the first photoresist layer includes a negative photoresist layer.

16. The method of claim 10, wherein the second photoresist layer includes a negative photoresist layer.

17. A method of forming a photoresist pattern, suitable for forming a dual damascene structural opening in a dielectric layer, comprising the steps of:
    forming a first photoresist layer over the dielectric layer;
    performing a first soft baking;
    performing a first photo-exposure;
    performing a first post exposure baking;
    conducting a first photoresist development process to form a first opening in the first photoresist layer, wherein the first opening exposes position of the desired via opening in the dielectric layer;
    forming a buffer layer to cover the first photoresist layer and the first opening;
    forming a second photoresist layer over the buffer layer;
    performing a second soft baking;
    performing a second photo-exposure;
    performing a second post exposure baking; and
    conducting a second photoresist development process to form a second opening in the second photoresist layer, wherein the second opening exposes position of a desired conductive wire trench, and wherein the conductive wire trench exposes the first opening.

18. The method of claim 17, wherein the first photoresist layer includes a positive photoresist layer.

19. The method of claim 17, wherein the second photoresist layer includes a positive photoresist layer.

20. The method of claim 17, wherein the first photoresist layer includes a negative photoresist layer.

21. The method of claim 17, wherein the second photoresist layer includes a negative photoresist layer.

22. The method of claim 17, wherein the step of forming the buffer layer includes depositing to form a hydrophilic anti-reflection coating.

23. The method of claim 17, wherein the step of forming the buffer layer includes depositing a hydrophilic chemical substance.

* * * * *